United States Patent [19]
Hayakawa et al.

[11] Patent Number: 5,531,329
[45] Date of Patent: * Jul. 2, 1996

[54] IC CARRIER TO WHICH AN IC CAN BE MOUNTED WITH THE LEADS THEREOF SUPPORTED IN A NON-CONTACTING STATE

[75] Inventors: Nanahiro Hayakawa; Satoshi Ohta, both of Tokyo, Japan

[73] Assignee: Yamaichi Electronics Co., Ltd., Tokyo, Japan

[*] Notice: The portion of the term of this patent subsequent to Nov. 30, 2013, has been disclaimed.

[21] Appl. No.: 371,615

[22] Filed: Jan. 12, 1995

Related U.S. Application Data

[63] Continuation of Ser. No. 149,722, Nov. 10, 1993, abandoned.

[30] Foreign Application Priority Data

Nov. 11, 1992 [JP] Japan .................................. 4-327425

[51] Int. Cl.⁶ .......................... B65D 73/02; B65D 85/42
[52] U.S. Cl. .................................. 206/722; 206/728
[58] Field of Search .................................. 206/328, 329, 206/331, 334, 701, 722, 724, 726, 728

[56] References Cited

U.S. PATENT DOCUMENTS

| | | | |
|---|---|---|---|
| 3,652,974 | 3/1972 | Tems | 206/329 |
| 4,556,145 | 12/1985 | Putnam | 206/329 |
| 4,718,548 | 1/1988 | Estrada et al. | 206/328 X |
| 4,765,471 | 8/1988 | Murphy | 206/329 |
| 4,767,984 | 8/1988 | Bakker | 206/329 X |
| 4,881,639 | 11/1989 | Matsuoka et al. | 206/328 |
| 5,026,303 | 6/1991 | Matsuoka et al. | 206/328 X |
| 5,066,245 | 11/1991 | Walker | 206/329 X |
| 5,080,228 | 1/1992 | Matson et al. | 206/331 |
| 5,263,583 | 11/1993 | Ohashi | 206/328 X |
| 5,291,994 | 3/1994 | Murphy | 206/331 |
| 5,375,710 | 12/1994 | Hayakawa et al. | 206/331 |

*Primary Examiner*—B. Dayoan
*Attorney, Agent, or Firm*—Wenderoth, Lind & Ponack

[57] ABSTRACT

An IC carrier has a retainer. This retainer is brought into engagement with an IC package body when an IC package is received in an IC receiving portion of the IC carrier, so that the IC package is assuredly retained by the IC carrier. A plurality of IC leads projecting sidewards from the IC package are fully accommodated within a lead-loosely-inserting space in a non-contacting state relative to the IC carrier.

8 Claims, 6 Drawing Sheets

5,531,329

IC CARRIER TO WHICH AN IC CAN BE MOUNTED WITH THE LEADS THEREOF SUPPORTED IN A NON-CONTACTING STATE

This application is a Continuation of now abandoned application, Ser. No. 08/149,722, filed on Nov. 10, 1993.

BACKGROUND OF THE INVENTION

1. Field of the Invention

This invention relates to an IC carrier used for supporting an IC package for the purposes of transport, storage, etc.

2. Brief Description of the Prior Art

In a typical conventional IC carrier as represented by that disclosed in U.S. Pat. No. 3,652,974, an IC package is carried by the carrier in a state in which an engagement claw engages an upper surface of an IC package body received in an IC receiving portion, a number of leads projecting sideward from the IC package extend through a number of slots formed in an upper surface of the carrier, and lower surfaces of the respective leads are supported on surfaces defining the bottoms of the slots, respectively.

When the lead pitches are comparatively large, the respective leads can easily be inserted into the corresponding slots. However, this IC carrier has shortcomings in that when the lead pitches are very small, there is a possibility that the respective leads will impinge respective slot partition walls and become deformed. Therefore, this structure is not suitable for use with the IC packages in which the leads are arranged at very small pitches as experienced recently.

There is also proposed a slotless type of IC carrier in to a load applied thereto. The deformation of the leads is particularly significant when the IC carrier is dropped.

Furthermore, all of the above prior art devices have the problem in that the lead supporting surface and the leads are subject to rub together, causing the lead surfaces to become damaged.

SUMMARY OF THE INVENTION

It is therefore an object of the present invention to provide an IC carrier which is capable of retaining an IC package with the leads thereof being in a free state, i.e. out of contact with the carrier.

A specific object of the present invention is to provide IC carrier in which an IC can be inserted without the leads thereof receiving a load so that the leads will not be deformed when the IC package is inserted into the IC carrier.

Another specific object of the invention is to provide an IC assemblage in which the leads of an IC mounted to an IC carrier are fully protected from being deformed even if the IC assemblage is dropped or the like.

A further specific object of the invention is to provide an IC assemblage in which the leads of an IC won't be rubbed by a surface of an IC carrier to which the IC is mounted, which rubbing would otherwise damage the surfaces of the leads.

A still further specific object of the invention is to provide an IC carrier which is capable of effectively coping with an IC having leads spaced at very small pitches. carrier, and an IC retainer means for retaining the IC package in the IC receiving portion, the IC retainer means being in engagement with the IC package body thereby preventing the IC package from moving upwardly or downwardly out of the IC carrier, and a lead-loosely-inserting space for accommodating the IC leads in a non-contacting state relative to the IC carrier, the space being formed at an area outside of the IC receiving portion.

DETAILED DESCRIPTION OF THE PREFERRED EMBODIMENTS

Embodiments of the present invention will be described in detail with reference to FIGS. 1 to 8 inclusive.

Figure 8:
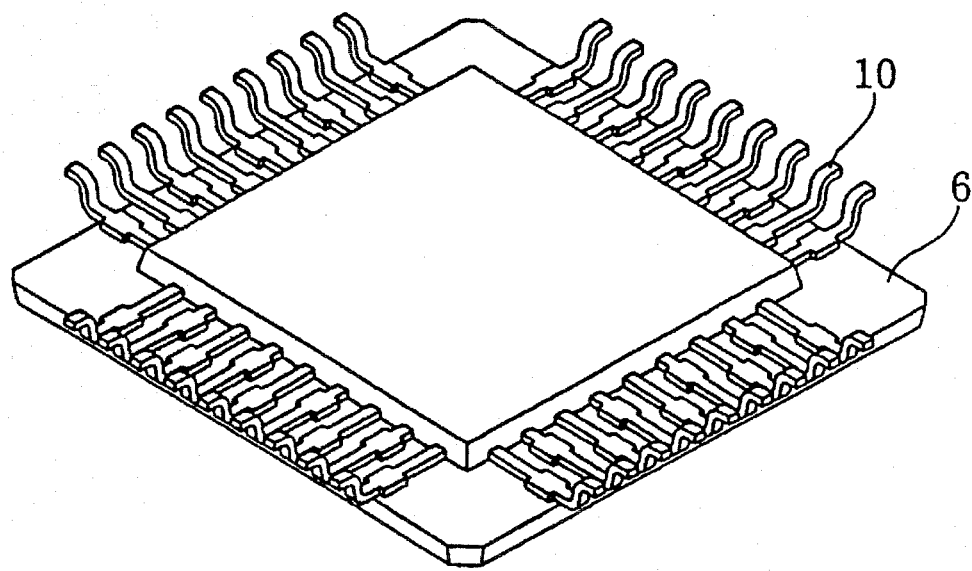
FIG. 8 is a perspective view of an IC package which is to be supported by the above respective embodiments.

The IC supporting members 4 are formed of plates, respectively, which protrude from at least, for example, one set of opposite sides of the frames (that is, from the central portions of one set of opposite frame elements of the frame 3) toward the IC receiving portion 2. On the upper surfaces of the plates, i.e., on the IC supporting members 4, an IC package body 6 of FIG. 8 is placed such that the corresponding lower surfaces of one set of opposite sides of the IC package body 6 are supported at their central portions thereon.

That is, when the IC package is received in the IC receiving portion 2, the above respective parts of the IC package body 6 are supported on the IC supporting members 4, respectively, thereby prohibiting the IC package body 6 from being moved toward the bottom of the IC receiving portion 2 of the IC carrier 1.

Preferably, each supporting member 4 is provided with a positioning rib 12 projecting from an upper surface thereof and extending along one side surface of the IC package body 6 so as to restrict movement of the side surface. As shown in FIG. 8, the IC package comprises a rectangular flat body having a number of leads 10 projecting sideways from each side thereof. As illustrated, these leads 10 project obliquely downwardly from the upper surface of the IC package body 6 toward the lower surface thereof, with lower ends thereof bent in a generally horizontal direction to provide a configuration somewhat similar to that of the leg of a crab.

The latch arms 5 are connected to the frame 3 at opposite ends, the upper surfaces of the respective corners of the IC package body 6.

A foremost end of each latch arm 5 is Y-shaped to define a regulating portion 7. The regulating portion 7 includes regulating elements 8a and 8b for positioning the IC package by receiving the corner of the IC package body 6. Either of the regulating elements 8a and 8b is provided with an engagement portion 9 projecting from an inner surface thereof. This engagement portion 9 is engaged with the upper surface of the corner portion of the IC package body 6 in order to prohibit the IC carrier from escaping out of the IC receiving portion 2.

Figure 1:
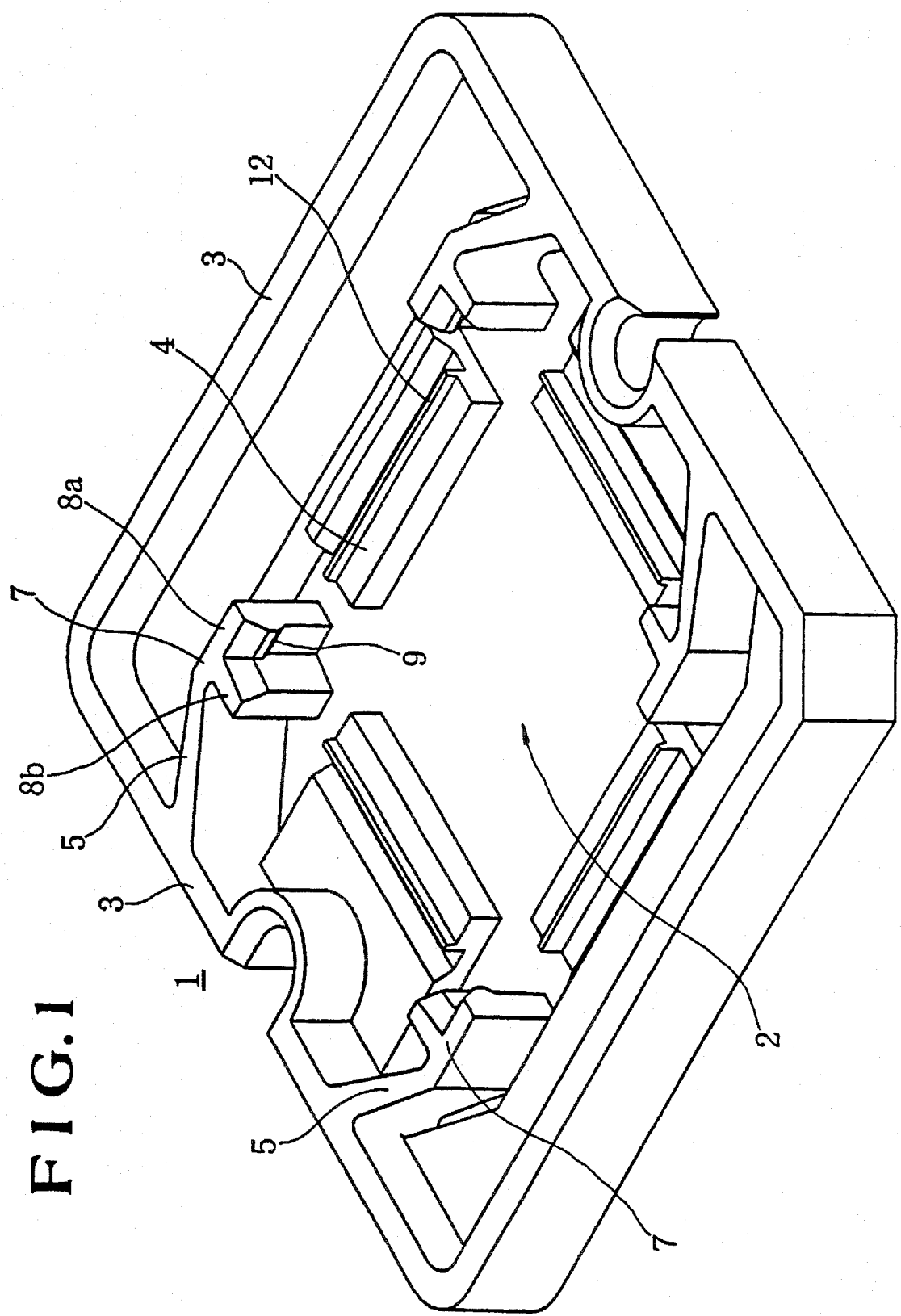
FIG. 1 is a perspective view of one embodiment of an IC carrier according to the present invention.
Figure 2:
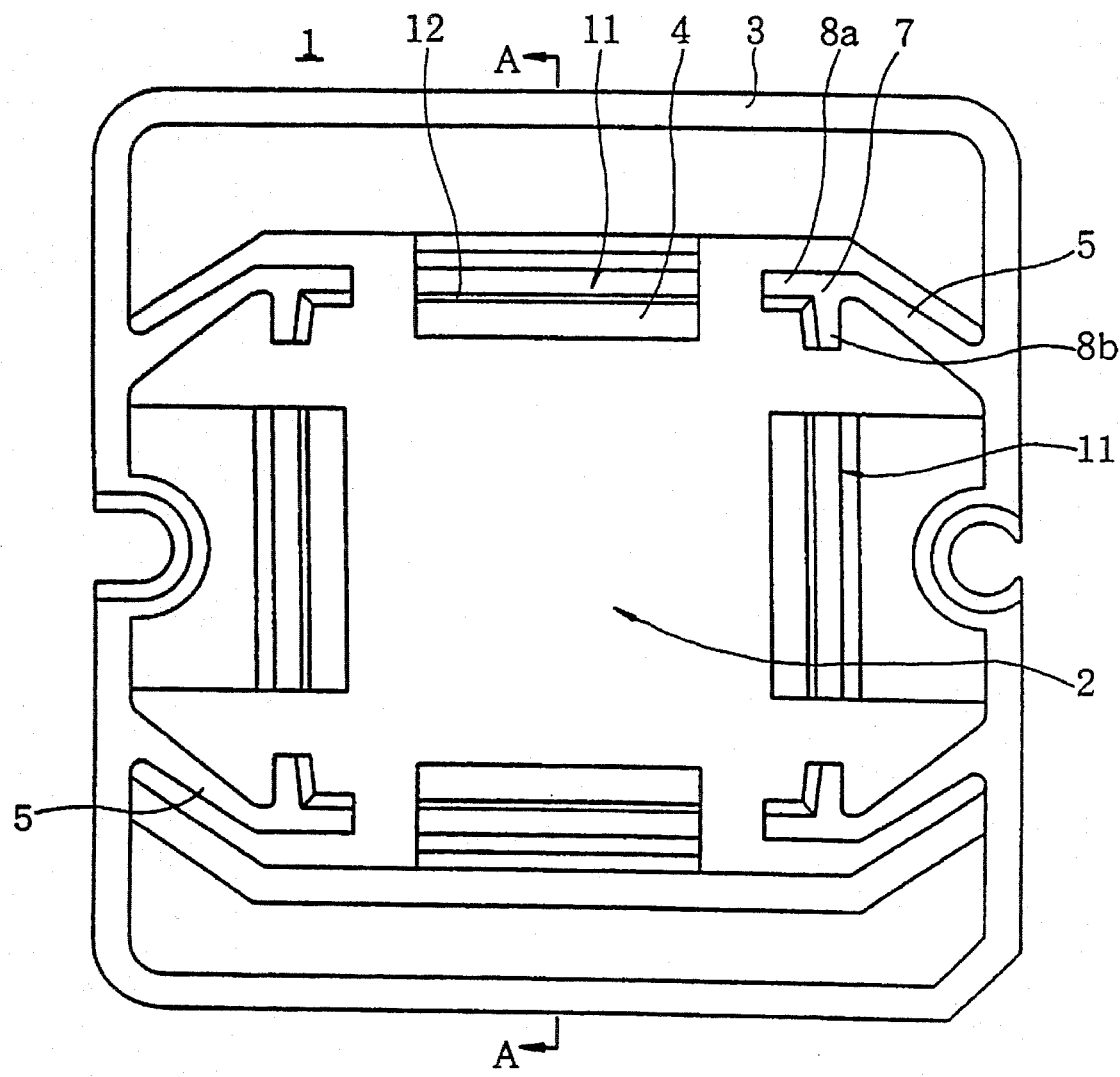
FIG. 2 is a plan view of the same.
Figure 3:
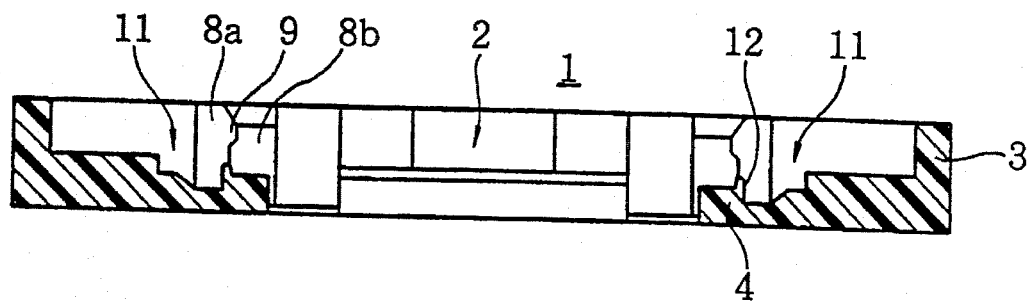
FIG. 3 is a cross-sectional view taken along line A—A of FIG. 2.
Figure 4:
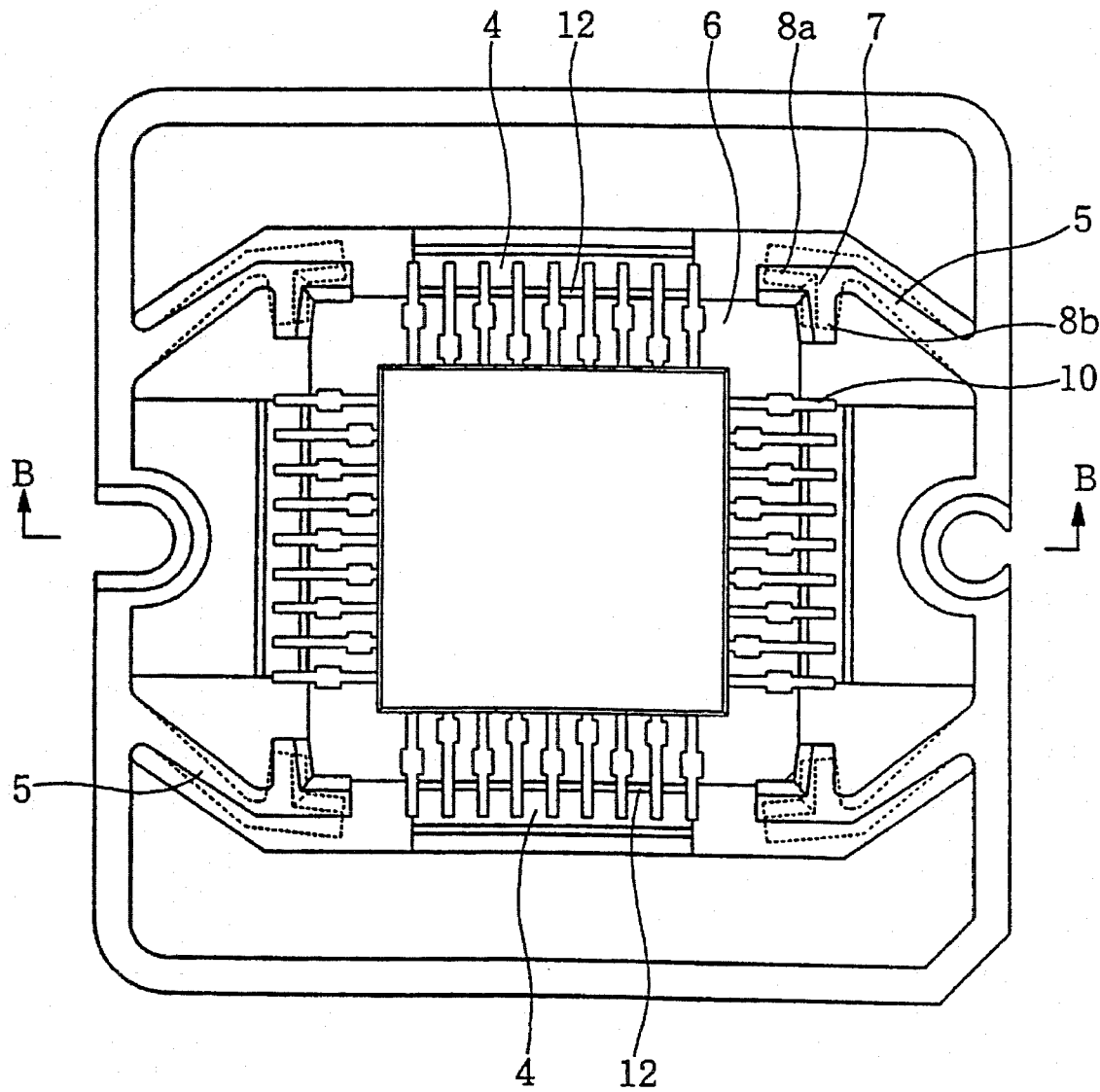
FIG. 4 is a plan view of the IC carrier in which an IC package is received.

As shown in FIG. 4, the latch arms 5 can be elastically displaced between engaging positions (as indicated by solid lines) and disengaging positions (as indicated by broken lines) respectively. By displacing the latch arms 5, respectively, to the disengaging positions with the use of a suitable tool, the latch arms 5 are disengaged from the IC package body 6 to permit the IC package to be taken out or re-inserted. When the pressure applied to the sides of the latch arms 5 by the suitable tool is removed, the latch arms 5 are elastically self-restored and come into engagement with the upper surfaces of the corners of the IC package.

More specifically, each latch arm 5 is elastically displaced (pivoted) about the area of its connection to the frame 3 in a horizontal direction, i.e., in a plane parallel to the upper and lower surfaces of the IC carrier 1, and during the elastic carry out the horizontal pivotal motion within a range of the thickness of the frame 3.

A lead-loosely-inserting space 11 is defined in an area outside of the IC receiving portion 2 and accommodates the IC leads 10 therein in a non-contacting condition relative to the IC carrier 1.

The lead-loosely-inserting space 11 includes open lead-accommodating spaces formed between adjacent latch arms 5 The upper and lower surfaces, opposite sides, and leading end of the IC leads 10 are fully accommodated within the lead-loosely-inserting space 11 in a free condition. In other words, all parts of the IC leads 10 are accommodated within the lead-loosely-inserting space 11 in a non-contacting condition relative to the wall surfaces defining the lead-loosely-inserting space 11.

The latch arms 5 extend inwardly from the respective sides of the IC carrier, i.e., inwardly from the longitudinally extending portions of the frame elements of the frame 3 or inwardly from the corners of the frame 3. However, if each latch arm 5 is formed the largest possible distance from each corner of the IC carrier 1 and extends obliquely toward a respective corner of the IC receiving portion 2, the horizontal pivotal motion of the latch arm 5 can be effectively performed.

Figure 5:
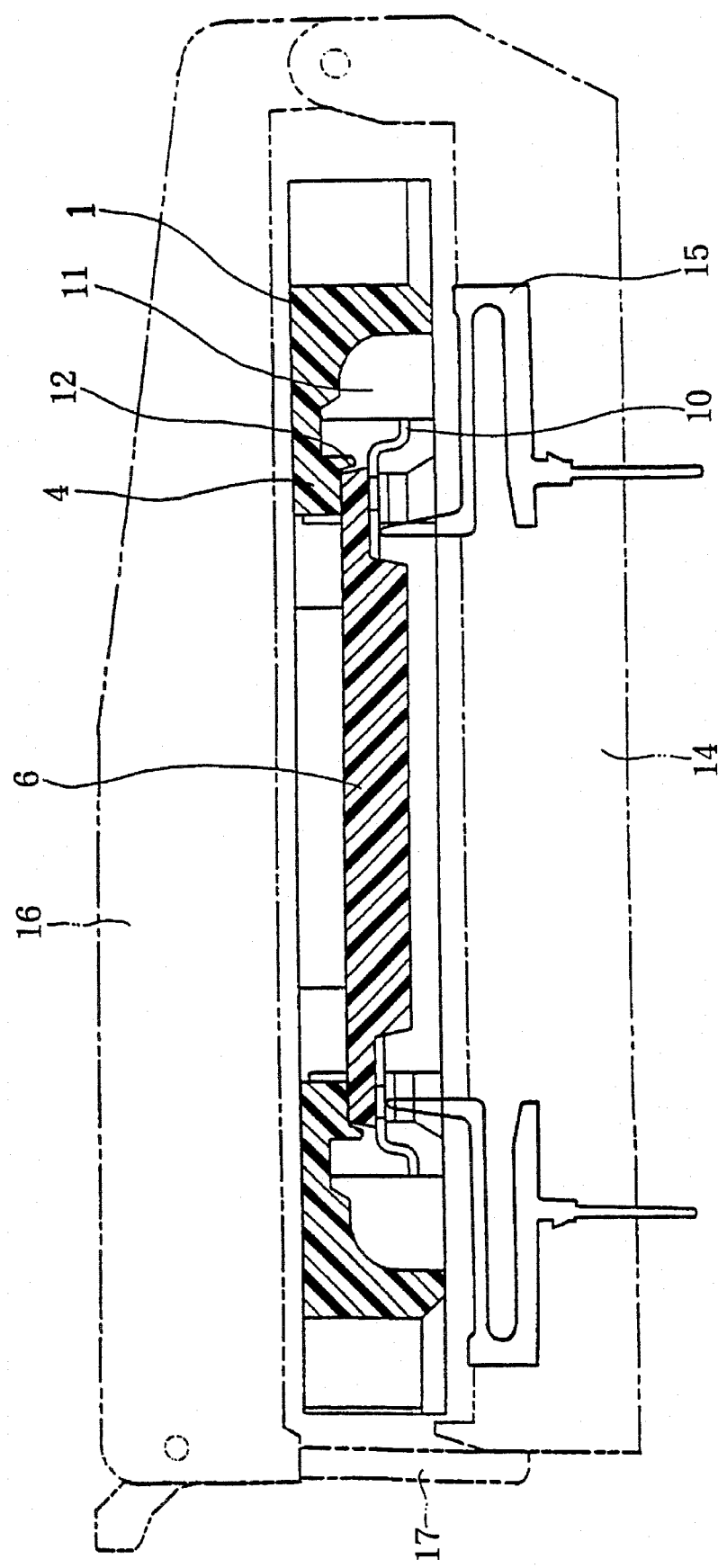
FIG. 5 is a cross-sectional view taken along line B—B of FIG. 4.

The IC carrier 1 carrying the IC package is used for protecting the IC while it is transported and stored. In addition, as shown in FIG. 5, the IC carrier 1 is used as a means mounted to the socket 14, the leads 10 are forced into contact with the contacts 15. This pressure contacting condition is maintained by a lock lever 17 engaging the socket 14.

Also, there may be employed an arrangement in which the above structure for receiving the IC leads 10 is used alone and in addition, the leading ends of the contacts 15 are interposed between the leads 10 and the carrier 1 with the contacts 15 contacting the leads 10.

Figure 6:
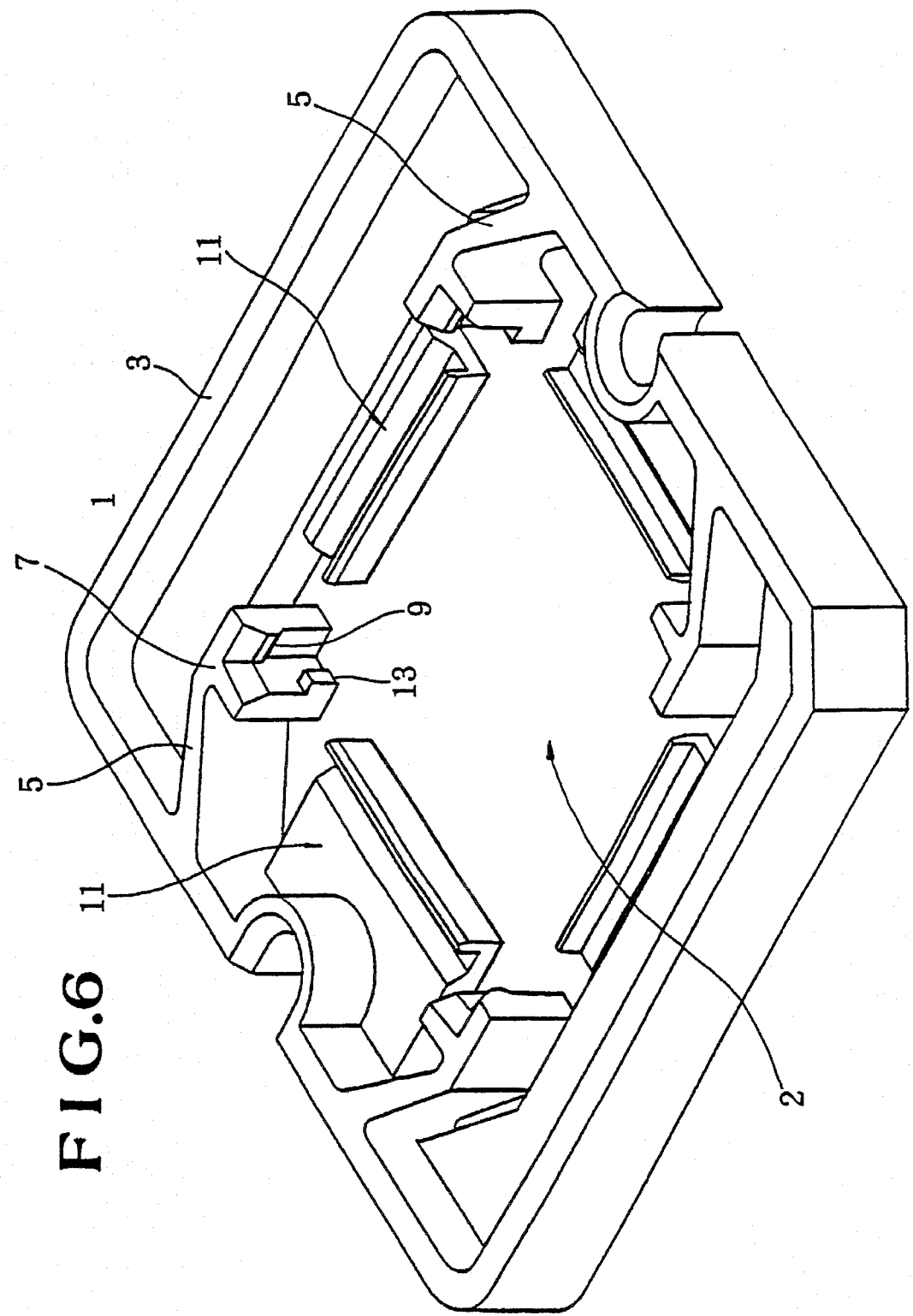
FIG. 6 is a perspective view of a second embodiment of an IC carrier according to the present invention.
Figure 7:
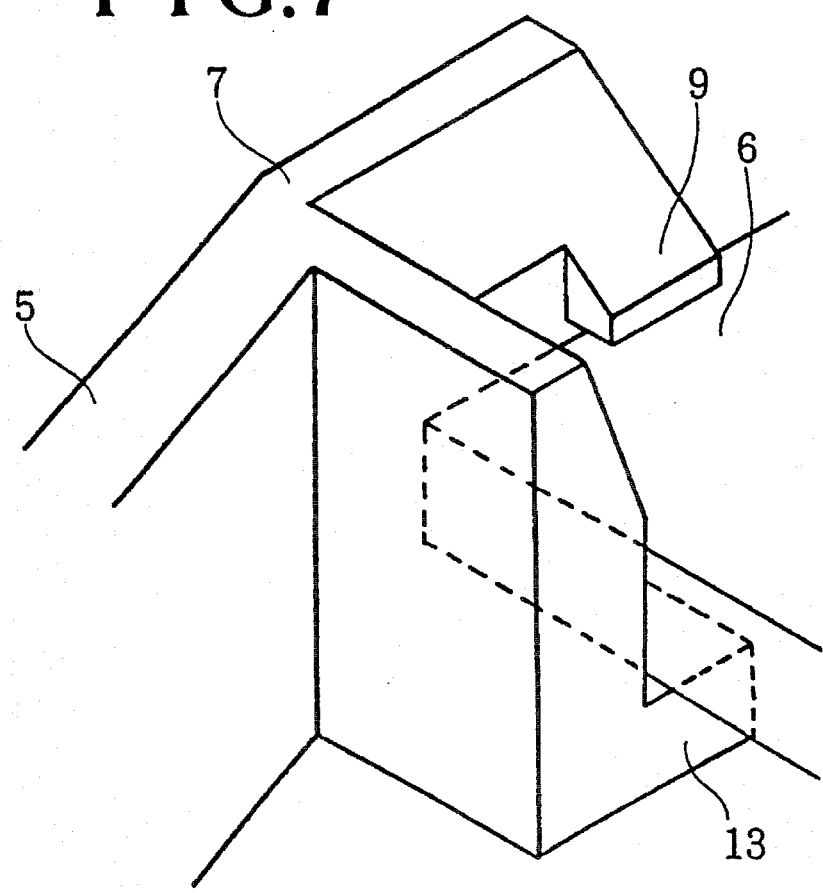
FIG. 7 is a perspective view showing an important part of one of the latch arms of the IC carrier of FIG. 6.

FIGS. 6 and 7 show another embodiment of the present invention.

In this embodiment, the latch arms 5 include retainer portions 9, 13 for preventing the IC package from moving in the vertical direction. Specifically, as in the case with the preceding embodiment, the latch arms 5 extend from the respective frame elements of the frame 3 toward the corners of the IC receiving portion 2. Each latch arm 5 has an upper engagement portion 9 adapted to engage an upper surface of the corner portion of the IC package body 6, and a lower engagement portion 13 adapted to engage a lower surface of the IC package body 6. The IC package body 6 is mounted to the IC carrier 1 through these engagement portions 9 and 13 in such a manner that the IC package body 6 cannot move upwardly or downwardly relative to the IC receiving portion of the IC carrier 1.

For example, as in the case with the preceding embodiment, a foremost end of each latch arm 5 is provided with a Y-shaped regulating portion 7 which includes regulating elements 8a and thereof and adapted to engage the lower surface of the corner of the IC package body 6. When positioning the IC package body 6, the corners of the IC package body 6 are brought into engagement with the inner sides of the regulating elements 8a and 8b, respectively. At the same time, the engagement portions 9 and 13 are brought into engagement with the upper and lower surfaces of the corners of the IC package body 6, respectively, so that the IC package is supported in the IC receiving portion 2 at a predetermined position.

For removing the IC package, the latch arms 5 are displaced horizontally by a suitable tool or the like.

Also in the above embodiment, the open lead-accommodating spaces of the lead-loosely-inserting space 11 are defined in an area outside of the IC receiving portion 2 and accommodate the IC leads 10, respectively, in a non-contacting state with respect to the IC carrier 1.

Each lead-accommodating space is formed between the adjacent latch arms 5. The upper and lower surfaces, opposite sides, and leading ends of the IC leads 10 are fully accommodated within the lead-loosely-inserting space 11 in a free condition.

According to the present invention, an IC assemblage is provided in which the IC leads are protected by being fully accommodated within the lead-loosely-inserting space in the IC carrier in a non-contacting state relative to the IC carrier while the IC package body is assuredly retained in the IC carrier.

Since the IC leads are present within the being fully guarded from an external object. These features enable the present invention to effectively cope with the increasing requirement for IC leads with very small pitches.

Although the present invention has been described with reference to the preferred embodiments, many changes and modifications may be made thereto without departing from the principle of the invention.

What is claimed is:

1. An IC carrier comprising:

an IC carrier peripheral frame having an upper surface defining an upper plane and a lower surface defining a lower plane;

a rectangular IC receiving portion defined inwardly of the frame and between said upper and lower planes for receiving a rectangular IC package body of an IC package, said rectangular IC receiving portion including four corners and four sides;

four latch arms each extending in a direction from the frame toward said IC receiving portion, each of said latch arms being pivotable in a horizontal plane parallel to the upper and lower planes only within a space bounded by the upper and lower planes, each of said latch arms having a free end disposed at a respective corner of the rectangular IC receiving portion for engaging a respective corner of the IC package body, each of the free ends of said latch arms having a Y-shaped section as taken in said horizontal plane;

wherein IC lead-receiving open spaces are provided outwardly of the rectangular IC receiving portion at locations adjacent and extending along at least two of the sides thereof and between adjacent free ends of said latch arms that are spaced from one another along each of said at least two sides of said rectangular IC receiving portion; and wherein said IC lead-receiving open spaces are uninterrupted spaces which extend in directions parallel to said at least two sides, respectively, of the IC receiving portion;

whereby the IC package having the rectangular IC package body and leads extending from the sides of the IC package body will be mounted in the IC receiving portion with the corners of the IC package body being restrained by the free ends of the latch arms and the leads being accommodated in said IC lead-receiving open spaces while out of contact with the IC carrier.

2. An IC carrier as claimed in claim 1, and further comprising an IC retainer including supporting members located adjacent the bottom of said IC receiving section, and engagement portions protruding from respective ones of the free ends of the latch arms at a level above the supporting members.

3. An IC carrier as claimed in claim 1, and further comprising an IC retainer including a pair of engagement protrusions protruding from at least one of the free ends of said latch arms, said protrusions being spaced from one another in a depthwise direction of said IC receiving portion extending between said upper and lower surfaces.

4. An IC carrier as claimed in claim 1, and further comprising retaining means for retaining the IC package body in said IC receiving portion such that the IC leads are disposed in said IC lead-receiving open spaces so as to be free from contact with said IC carrier.

5. An IC carrier as claimed in claim 4, wherein said retaining means comprises supporting members fixed to said frame and extending into said IC receiving portion to support a bottom surface of the IC package body.

6. An IC carrier as claimed in claim 4, wherein said retaining means comprises lower engagement portions formed on said free ends of said latch arms and extending inwardly for supporting a bottom surface of the IC package body.

7. An IC carrier as claimed in claim 6, and further comprising upper engagement portions formed on said free ends of said latch arms and extending inwardly for engaging a top surface of the IC package body.

8. An IC assemblage comprising an IC package having a rectangular IC package body and groups of leads projecting sideways from sides of said body, and an IC carrier supporting said IC package in a state in which all of the leads of the IC package are out of contact with all portions of the IC carrier, wherein said IC carrier comprises:

an IC carrier peripheral frame having an upper surface defining an upper plane and a lower surface defining a lower plane;

a rectangular IC receiving portion defined inwardly of the frame and between said upper and lower planes for receiving said rectangular IC package body of said IC package, said rectangular IC receiving portion including four corners and four sides;

four latch arms each extending in a direction from the frame toward said IC receiving portion, each of said latch arms being pivotable in a horizontal plane parallel to the upper and lower planes only within a space bounded by the upper and lower planes, each of said latch arms having a free end disposed at a respective corner of the rectangular IC receiving portion for engaging a respective corner of said IC package body, each of the free ends of said latch arms having a Y-shaped section as taken in said horizontal plane;

wherein IC lead-receiving open spaces are provided outwardly of the rectangular IC receiving portion at locations adjacent and extending along at least two of the sides thereof and between adjacent free ends of said latch arms that are spaced from one another along each of said at least two sides of said rectangular IC receiving portion; and wherein said IC lead-receiving open spaces uninterrupted spaces which extend in directions parallel to said at least two sides, respectively, of the IC receiving portion;

whereby said IC package having said rectangular IC package body and said leads extending from the sides of the IC package body will be mounted in the IC receiving portion with the corners of said IC package body being restrained by the free ends of the latch arms and the leads being accommodated in said IC lead-receiving open spaces while out of contact with the IC carrier.

* * * * *